(12) United States Patent
Ishino et al.

(10) Patent No.: US 7,638,362 B2
(45) Date of Patent: Dec. 29, 2009

(54) MEMORY MODULE WITH IMPROVED MECHANICAL STRENGTH OF CHIPS

(75) Inventors: Masakazu Ishino, Chuo-ku (JP); Hiroaki Ikeda, Chuo-ku (JP)

(73) Assignee: Elpida Memory, Inc., Tokyo (JP)

( * ) Notice: Subject to any disclaimer, the term of this patent is extended or adjusted under 35 U.S.C. 154(b) by 280 days.

(21) Appl. No.: 11/382,347

(22) Filed: May 9, 2006

(65) Prior Publication Data
US 2006/0267188 A1 Nov. 30, 2006

(30) Foreign Application Priority Data
May 16, 2005 (JP) .............................. 2005-142472

(51) Int. Cl.
*H01L 21/00* (2006.01)
(52) U.S. Cl. ...................... 438/107; 438/109; 438/108; 438/111; 438/113; 438/118; 257/686; 257/778; 257/737
(58) Field of Classification Search ......... 438/107–118; 257/686, 778, 737
See application file for complete search history.

(56) References Cited

U.S. PATENT DOCUMENTS

| | | | | |
|---|---|---|---|---|
| 2001/0054771 | A1* | 12/2001 | Wark et al. | 257/786 |
| 2002/0132463 | A1* | 9/2002 | Urushima | 438/613 |
| 2003/0071348 | A1* | 4/2003 | Eguchi et al. | 257/723 |
| 2004/0251540 | A1* | 12/2004 | Eguchi et al. | 257/713 |
| 2005/0189639 | A1* | 9/2005 | Tanie et al. | 257/686 |

FOREIGN PATENT DOCUMENTS

| | | |
|---|---|---|
| JP | 58-56454 A | 4/1983 |
| JP | 63-156348 | 6/1988 |
| JP | 6-291250 A | 10/1994 |
| JP | 6-334068 A | 12/1994 |
| JP | 7-183453 A | 7/1995 |
| JP | 2001-053218 | 2/2001 |
| JP | 2002-170919 | 6/2002 |
| JP | 2003-086761 | 3/2003 |
| JP | 2004-273515 | 9/2004 |
| JP | 2005-005529 | 1/2005 |
| JP | 2005-244143 A | 9/2005 |

OTHER PUBLICATIONS

Japanese Patent Publication No. 63-156348, published Jun. 29, 1988, with English abstract.
Japanese Patent Publication No. 2002-170919, published Jun. 14, 2002, with English abstract.

(Continued)

*Primary Examiner*—M. Wilczewski
*Assistant Examiner*—Telly D Green
(74) *Attorney, Agent, or Firm*—Sughrue Mion, PLLC

(57) ABSTRACT

A memory module of the present invention has a memory core chip for storing information, an interface chip for controlling data input/output, an interposer chip for transmitting/receiving data to/from the outside, and an external connection terminal provided in closest proximity to the interposer chip. A heat dissipating plate is provided in closest proximity to the interface chip. The interposer chip has a substrate made of a semiconductor material that is similar to the memory core chip, a land for holding the external connection terminal, a wire connected to the external connection terminal, and an insulating film for insulating the wire. The land, wire, and insulating film are integrally formed on one surface of the interposer chip.

14 Claims, 7 Drawing Sheets

OTHER PUBLICATIONS

Japanese Patent Publication No. 2001-053218, published Feb. 23, 2001, with English abstract.
Japanese Patent Publication No. 2003-086761, published Mar. 20, 2003, with English abstract.
Japanese Patent Publication No. 2004-273525, published Sep. 30, 2004, with English abstract.
Japanese Patent Publication No. 2005-005529, published Jan. 6, 2005, with English abstract.

* cited by examiner

MEMORY MODULE WITH IMPROVED MECHANICAL STRENGTH OF CHIPS

BACKGROUND OF THE INVENTION

1. Field of the Invention

The present invention relates to a memory module having a semiconductor memory chip, and a method of manufacturing the same.

2. Description of the Related Art

Heretofore, JP-A-63-156348 and JP-A-2002-170919 disclose structures for laminating a plurality of LSI's (Large Scale Integrated circuit) by providing through-electrodes in semiconductor chips made of silicon or the like which are formed with circuits, and methods of manufacturing such structures. In these disclosed techniques, laminated LSI's and underlying substrates are all singularized into chips, and sequentially laminated using connection electrodes provided in each of the chips to form a memory module having desired functions.

In the techniques disclosed in the foregoing documents, the lowermost chip is in danger of breakage because it is repeatedly applied with force when bumps are bonded or thermo-compression bonded to each other. The chip is more likely to be broken as it is reduced in thickness with the intention to reduce the thickness of the overall memory module.

Also, since a memory module comprises a plurality of laminated chips, the influence exerted by heat coming from the plurality of chips must be taken into consideration when the memory module is operated.

SUMMARY OF THE INVENTION

It is an object of the present invention to provide a memory module in which the thinner chips have improved mechanical strength, and a method of manufacturing the same.

According to the present invention, a memory module comprises a memory core chip for storing information; an interface chip for controlling input/output of data to/from the memory core chip; an interposer chip for transmitting and receiving the data between the interface chip and the outside; and an external connection terminal provided in closest proximity to the interposer chip for electrically connecting to the outside, wherein a heat dissipating plate is provided in closest proximity to the interface chip of the memory core chip, the interface chip, and the interposer chip, and the interposer chip comprises a substrate made of a semiconductor material that is similar to the memory core chip, a land for holding the external connection terminal, a wire connected to the external connection terminal, and an insulating film for insulating the wire, the land, the wire, and the insulating film being integrally formed on one surface of the interposer chip.

According to the present invention, a memory module comprises a memory core chip for storing information; an interface chip for controlling input/output of data to/from the memory core chip; an interposer chip for transmitting and receiving the data between the interface chip and the outside; and an external connection terminal provided closest to the interposer chip for electrically connecting to the outside, wherein a heat dissipating plate is provided closer to the interface chip than the memory core chip and the interposer chip, and the interposer chip comprises a substrate made of a semiconductor material that is similar to the memory core chip, and a resin tape or a resin substrate adhered to the substrate, the resin tape or resin substrate being smaller in thickness than the substrate, and previously formed with a land for holding the external connection terminal, and a wire connected to the external connection terminal.

According to the present invention, a method of manufacturing a memory module having a memory core chip for storing information, an interface chip for controlling data input/output to/from the memory core chip, and an interposer chip for transmitting/receiving the data between the interface chip and an outside, the method comprises the steps of: adhering a support to a surface of the interface chip opposite to a surface on which a bump is formed; placing the memory core chip on the surface of the interface chip on which the bump is formed, and thermo-compression bonding the bumps of the interface chip and the memory core chip to each other; and placing the interposer chip on the memory core chip, and thermo-compression bonding the bumps of the memory core chip and the interposer chip to each other.

According to the present invention, a heat dissipating plate is provided in closest proximity to an interface chip which generates a large amount of heat, and functions as a heat dissipating fin, thus making it possible to efficiently dissipate heat generated by operations. The overall memory module is prevented from being heated to high temperatures to restrain failures from occurring due to the heat caused by operations.

Since an interposer chip has a substrate made of a semiconductor material that is similar to that of a memory core chip, the resulting memory module is prevented from thermal strains and distortions which would occur when both chips differ in coefficient of thermal expansion within an operable temperature range of the memory module. Accordingly, external connection terminals can be provided at a high density in closest proximity to the interposer chip. Further, since the heat dissipating plate is utilized as a support, the memory module exhibits an increased mechanical strength against forces applied from the outside, and can therefore have thin semiconductor chips laminated therein.

The above and other objects, features and advantages of the present invention will become apparent from the following description with reference to the accompanying drawings which illustrate examples of the present invention.

DETAILED DESCRIPTION OF THE PREFERRED EMBODIMENTS

A memory module of the present invention is characterized in that a heat dissipating plate is provided in proximity to an interface chip for dissipating heat generated by the operating memory module, and a substrate, which underlies an interposer chip, is made of a semiconductor material that is similar to a memory core chip in order to restrain thermal strains and distortions due to heat.

A method of manufacturing a memory module in turn is characterized in that the heat dissipating plate serves as a support for increasing the mechanical strength of the chips. The method is also characterized by manufacturing a plurality of memory modules based on a single support.

Figure 1:
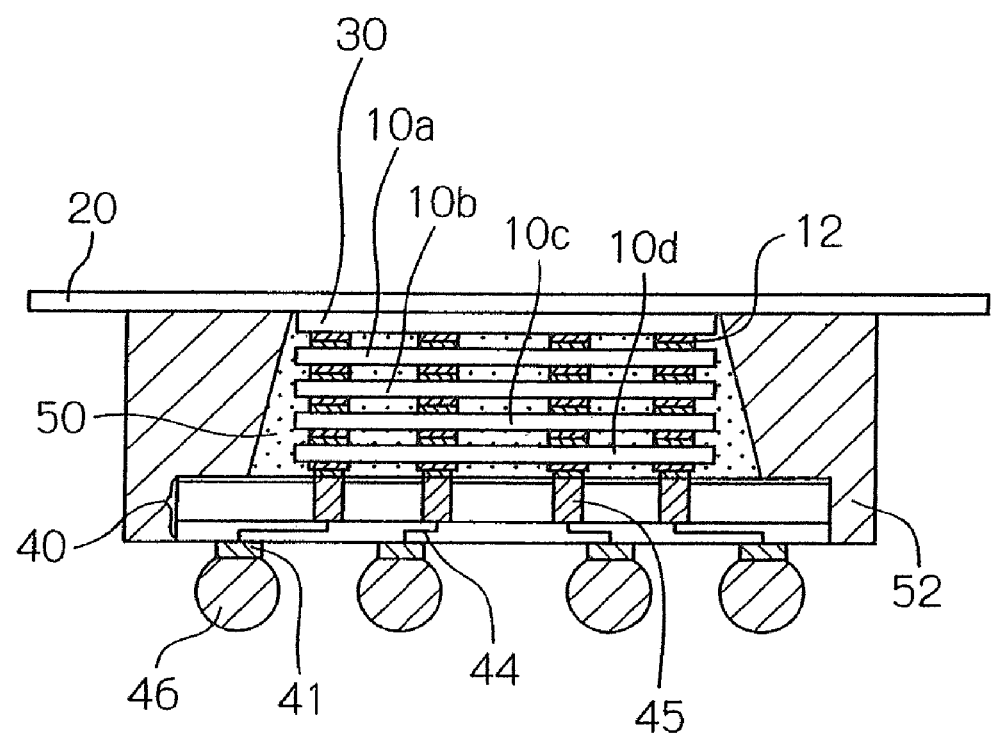
FIG. 1 is a schematic cross-sectional view illustrating an exemplary configuration of a memory module according to one embodiment.

In one embodiment, laminated memories are DRAM's (Dynamic Random Access Memory). FIG. 1 is a schematic cross-sectional view illustrating an exemplary configuration of a memory module according to this embodiment.

As illustrated in FIG. 1, the memory module of this embodiment comprises memory core chips 10*a*-10*d*; interposer chip 40 for transmitting and receiving signals to and from the outside; and interface chip 30 for controlling the transmission and reception of data to and from memory core chips 10*a*-10*d* in response to control signals received from interposer chip 40. Underfill 50 is filled in between the chips to prevent the chips from being broken by external forces. Mold resin 52 is provided outside underfill 50. Underfill 50 prevents moisture from being introduced into interstices between the chips.

Mold resin 52 is molded to cover side surfaces of interface chip 30, memory core chips 10*a*-10*d*, and interposer chip 40. This reduces the peeling force generated on the interface between mold resin 52 and interposer chip 40 to increase the mechanical strength of the memory module. Also, mold resin 52 improves the reliability because it prevents moisture from being introduced from the interface to improve humidity resistance and water resistance, restrains soft errors from occurring due to an alpha-ray, and the like.

Interface chip 30 controls signals associated with the DRAM's. Lead frame (support) 20, which serves as a heat dissipating plate, adheres to a surface of interface chip 30 opposite to a circuit forming surface through an adhesive layer (not shown). A polyimide tape of 15 um thick was used for the adhesive layer. Lead frame 20 serves as a heat dissipating plate for dissipating heat generated by the operation of the memory module into the atmosphere. Since the overall back surface of interface chip 30 adheres to lead frame 20, heat generated in interface chip 30 is rapidly conducted to the back surface and is dissipated from lead frame 20. Since the heat dissipating plate is provided in close proximity to interface chip 30 which generates a large amount of heat, it is possible to efficiently dissipate the heat generated by the operation of interface chip 30.

Lead frame 20 also serves as a support for interface chip 30 during the process of manufacturing the memory module. Functions provided by this support will be described later. The material of lead frame 20 preferably exhibits a higher strength as a support and a higher thermal conductivity as a heat dissipating plate. In this embodiment, a 42-alloy (Fe.42% Ni) metal is used for lead frame 20. While any number of memory core chips may be laminated, four memory core chips are laminated in this embodiment. Also, in the following, reference numeral 10 will be used for descriptions common to memory core chips 10*a*-10*d*.

Through-electrodes 12 are provided through memory core chips 10. Through-electrodes 12 each have bumps on the top and bottom ends, and memory core chip 10 is electrically connected to the other laminated memory core chips 10 through through-electrodes 12. FIG. 1 illustrates only the bumps of through-electrodes 12. Through-electrodes 12 include those which are not connected to the internal circuits of associated memory core chips 10 and those which are connected to associated internal circuits 10. Through-electrodes 12 not connected to internal circuits are used to transmit and receive signals and data between interposer chip 40 and interface chip 30. Some of through-electrodes 12 connected to internal circuits are used to input and output data to and from associated memory core chips 10. In this embodiment, interface chip 30 and memory core chips 10 are 50 um in thickness, but these chips are only required to be 100 um or less in thickness. This is because those chips having a thickness larger than 100 um would result in an increased thickness of the overall memory module.

Interposer chip 40 comprises solder balls 46 which serve as external connection terminals for electric connection to the outside, and lands 41 for mounting solder balls 46 on interposer chip 40. Solder balls 46 are electrically connected to through-electrodes 12 of memory core chip 10*d* through lands 41, wires 44, and embedded conductors 45.

Also, interposer chip 40 shown in FIG. 1 is made of a semiconductor substrate of a material homogenous to memory core chips 10, and is provided with electrodes extending through the semiconductor substrate at a high density. Wires 44 are provided on at least one surface of the semiconductor substrate for converting an electrode pitch.

Also, as illustrated in FIG. 1, interposer chip 40 has an insulating film, wires 44, and lands 41 formed integrally with the semiconductor substrate. While a method of forming interposer chip 40 will be described later, these components may adhere to the semiconductor substrate after they have been formed on a resin tape or a resin substrate which has a smaller thickness than the semiconductor substrate.

When a module is formed by laminating interposer chip 40 and memory core chips 10*a*-10*d* in the foregoing manner, the resulting module is less susceptible to thermal strains and distortions caused by a difference in the coefficient of thermal expansion between both components. As a result, external connection terminals such as solder balls 46 can be provided over the overall bottom surface of the chip. It has been confirmed by investigations made by the inventors that the total thickness of interposer chip 40 formed as described above is preferably equal to or smaller than 0.1 mm and equal to or larger than the thickness of memory core chip 10 because the resulting module satisfies the requirements for both mechanical strength and overall thickness. Therefore, the foregoing configuration permits multiple solder balls 46 to be provided beneath the chip as well, thus realizing a memory module which comprises external connection terminals at a high density.

When the laminated chip having interface chip 30, memory core chips 10*a*-10*d*, and interposer chip 40 is encapsulated by a resin, side walls of all chips having interposer chip 40 are covered with the resin. This increase the strength of the memory module, and prevents moisture from being introduced through peeling and interstice of interposer chip 40, thus improving the reliability of the memory module.

It should be noted that the size of solder balls 46 shown in FIG. 1 is larger than the actual size as compared with the lateral size of interposer chip 40. Also, circuits on interface chip 30 and memory core chips 10 are omitted in the illustration. The same applies to the remaining figures.

Figure 2A:
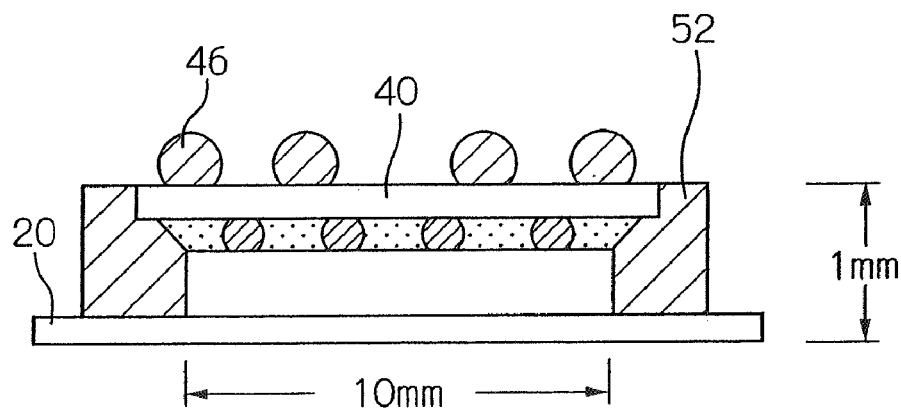
FIG. 2A is a cross-sectional view of the memory module illustrated in the embodiment of FIG. 1.
Figure 2B:
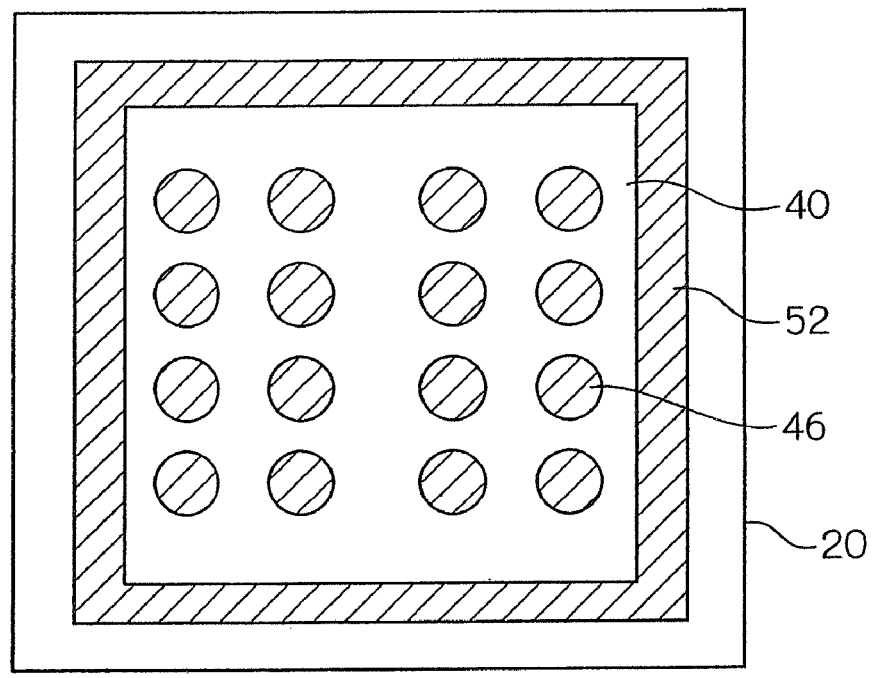
FIG. 2B is a top plan view of the memory module illustrated in the embodiment of FIG. 1.

FIG. 2A is a cross-sectional view of the memory module, and FIG. 2B is a top plan view of the memory module.

FIG. 2A illustrates the surface of interposer chip 40 on which solder balls 46 are formed on the upper side of the figure. In the memory module illustrated in FIG. 2A, the overall thickness is 1 mm, and interposer chip 40 has a thickness of 0.1 mm. Also, as illustrated in FIG. 2A, interface chip 30 has a width of 10 mm. Solder balls 46 each have a diameter of 0.4 mm, and solder balls 46 are illustrated larger as compared with the lateral length of the memory module, as is the case with FIG. 1.

As illustrated in FIG. 2B, when viewed from the surface of interposer chip 40 on which solder balls 46 are formed, the geometry of surrounding mold resin 52 is larger than interposer chip 40, and the geometry of lead frame 20 is larger than mold resin 52. While the area of lead frame 20 is larger than that of interposer chip 40 in this embodiment, lead frame 20 may be equal in size to interposer chip 40 and mold resin 52. When lead frame 20 is made to be equal sized to interposer chip 40, lead frame 20 may be suspended by leads. Lead frame 20 having a larger area further improves the heat dissipation.

Next, a brief description will be given of the operation of the memory module according to this embodiment.

A read operation is performed in the following procedure. As a control signal for reading data is applied to interposer chip 40 through solder balls 46 from the outside, the control signal is applied to interface chip 30 through through-electrodes 12 of memory core chips 10a-10d. Next, interface chip 30 sends a data read instruction signal and an address specifying signal to memory core chips 10 through through-electrodes 12. Then, predetermined memory core chip 10 of memory core chips 10a-10d is made operative to deliver data at a specified address to interface chip 30. Interface chip 30 sends the received data to interposer chip 40 through through-electrodes 12.

On the other hand, a write operation is performed according to the following procedure. As a control signal for writing data is applied to interposer chip 40 through solder balls 46 from the outside, the control signal is applied to interface chip 30 through through-electrodes 12 of memory core chips 10a-10d. Interface chip 30 sends a data write instruction signal and an address specifying signal to memory core chips 10 through through-electrodes 12. Then, predetermined memory core chip 10 of memory core chips 10a-10d is made operative, thereby causing data to be applied to and written into operative memory core chip 10 through external electrodes 12 from the outside.

In the memory module of this embodiment, heat generated by the operation of memory module is conducted to interface chip 30 through through-electrodes 12 and underfill 50, and is dissipated into the atmosphere from lead frame 20. Also, as mentioned above, interface chip 30 generates a larger amount of heat than other chips because interface chip 30 transmits and receives signals and data to and from interposer chip 40 and memory core chips 10. Since lead frame 20 is in close contact with interface chip 30 which generates a large amount of heat, the heat generated by interface chip 30 efficiently diffuses in the atmosphere.

In the present invention, lead frame 20 provided in closest proximity to interface chip 30 from among a plurality of laminated chips functions as a heat dissipating fin. For this reason, lead frame 20 not only efficiently dissipates heat generated from interface chip 30 but also prevents the overall memory module from heating to high temperatures and thus restrains failures caused by high temperatures operations.

Next, a description will be given of a method of manufacturing memory core chip 10 illustrated in FIG. 1.

FIGS. 3A to 3D are cross-sectional views for describing a method of manufacturing the memory core chip.

Figure 3A:
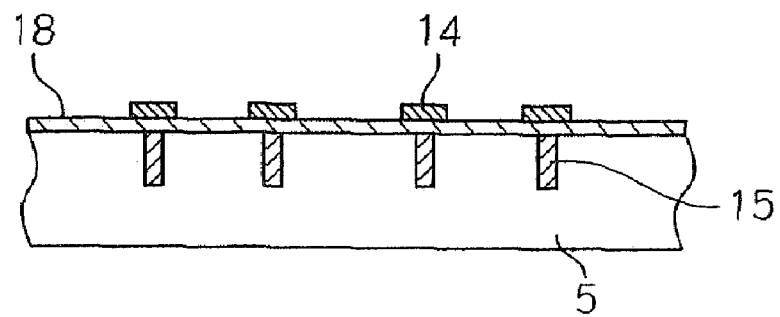
FIGS. 3A to 3D are cross-sectional views for describing a method of manufacturing a memory core chip.

After protection film 18 is formed on semiconductor substrate 5, openings are formed by a lithographic step and an etching step in order to extend through protection film 18 into semiconductor substrate 5 at a depth of 50 um or more. Next, conductive material 15 is embedded into the openings, followed by the formation of DRAM circuits on semiconductor substrate 5 in a manner similar to before. Then, bumps 14 are formed on conductive materials 15 as electrode pads. FIG. 3A illustrates a cross-sectional view of the resulting semiconductor substrate. Assume that a circuit forming surface of semiconductor substrate 5 is a front surface, and the opposite side is a back surface. Also, here, Au/Cu is used for bumps 14, and polysilicon is used for conductive material 15.

Figure 3B:
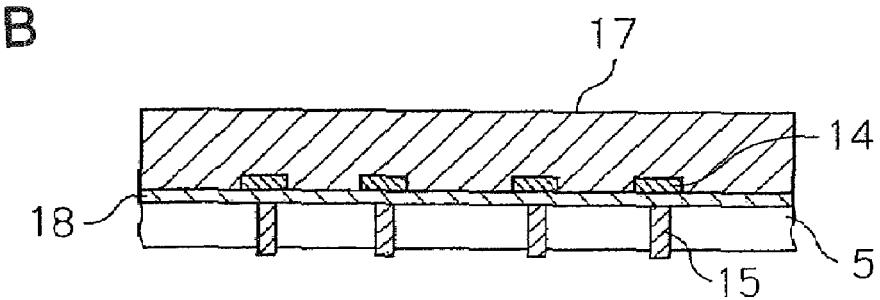
Figure 3C:
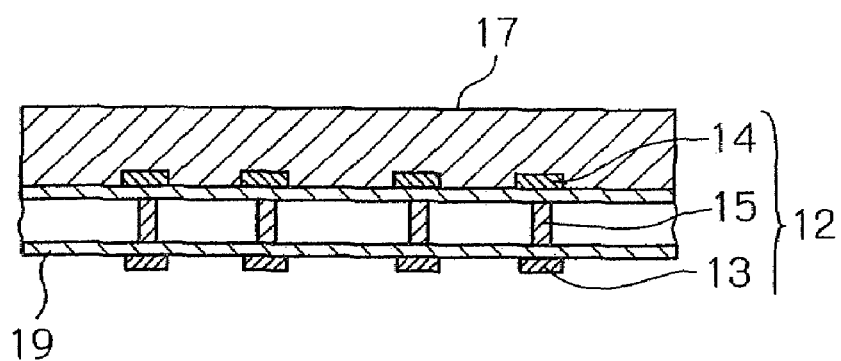
Figure 3D:
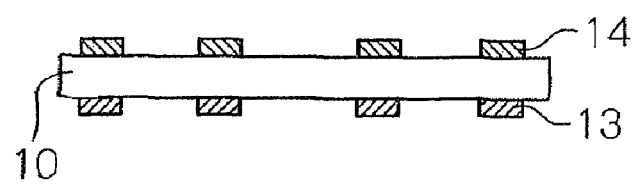

Next, supporting substrate 17 adheres on the front surface of semiconductor substrate 5, and semiconductor substrate 5 is then ground by a BG (back grind) method from the back until the thickness of semiconductor substrate 5 is reduced to 50 um. As illustrated in FIG. 3B, grinding based on the BG method is stopped when embedded conductive materials 15 become exposed on the back side, followed by the formation of insulating film 19 on the back surface. In this event, the peaks of conductive materials 15 are exposed. Then, bumps 13 are formed on the exposed peaks of conductive materials 15 as electrode pads (FIG. 3C). Sn/Cu is used for bumps 13. In this way, through-electrodes 12 is formed with bumps 14 on the front surface connected to bumps 13 on the back surface through conductive materials 15. Then, supporting substrate 17 is removed, and the resulting substrate is diced for singularization into chips (FIG. 3D). In this way, four memory core chips 10a-10d are created. It should be noted that in FIG. 3D onward, conductive materials 15 are omitted in the illustration.

Next, a description will be given of a method of manufacturing interposer chip 40 illustrated in FIG. 1.

FIGS. 4A to 4D are cross-sectional views for describing a method of manufacturing the interposer chip.

Figure 4A:
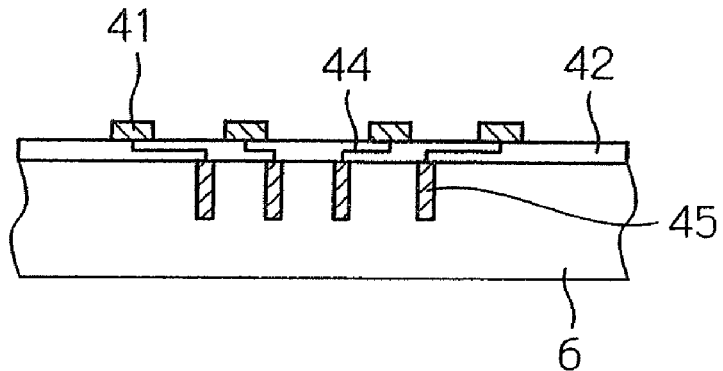
FIGS. 4A to 4D are cross-sectional views for describing a method of manufacturing an interposer chip.
Figure 4B:
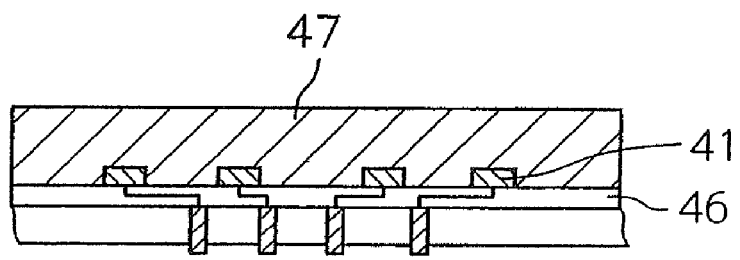

After openings have been formed by a lithographic step and an etching step, each having a diameter of 10 um to a depth of 0.1 mm or more from the surface of semiconductor substrate 6, a conductive material is embedded in the openings to form embedded conductors 45. Assume herein that the front surface of semiconductor substrate 6 is oriented toward the upper side of the figure, and the back surface of the same is oriented toward the opposite side. Next, wires 44 are formed in a predetermined pattern using a lithographic step and a plating step in the following manner. Photo-sensitive polyimide is used for insulating film 42, and via holes are formed between layers through exposure and development. Wires 44 are formed by a metal plating step with copper or the like, and one end of each wire 44 is connected to embedded conductor 45, while the other end is connected to land 41. In this way, semiconductor substrate 6, insulating film 42, wires 44, and lands 41 are formed integrally as a whole (FIG. 4A).

Alternatively, the coating or adhesion of the photo-sensitive polyimide, exposure and development, and metal plating step may be repeated a plurality of times to provide multi-layer wires. Lands 41 are also formed by plating a metal layer on the surface layer, and patterning the metal layer. Alternatively, a method other than the foregoing may involve processing a semiconductor substrate for the interposer, and adhering a resin tape or a resin substrate to the semiconductor substrate, where the resin tape or resin substrate has a thickness smaller than the semiconductor substrate, and has a wiring pattern and lands previously formed thereon. Since either the resin tape or resin substrate has a thickness smaller than the semiconductor substrate, the coefficient of thermal expansion is dominated by the semiconductor substrate when both adhere to each other, thus making it possible to prevent the aforementioned thermal strains and distortions.

Next, supporting substrate 47 adheres to insulating film 42, and the back surface of the substrate is ground by a BG method until embedded conductors 45 become exposed (FIG.

Figure 4C:
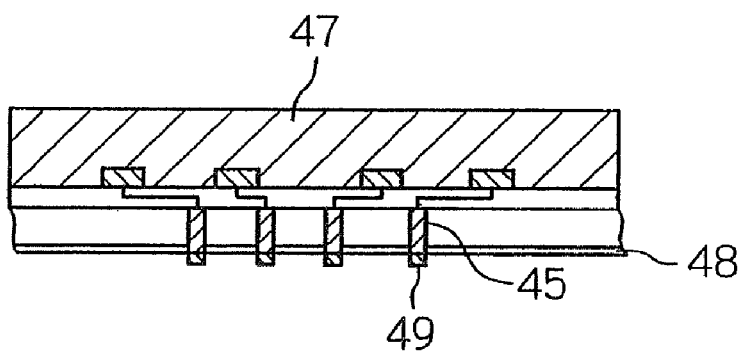
Figure 4D:
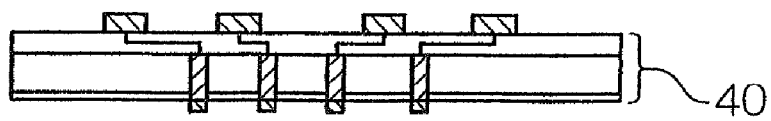

4B). Next, insulating film 48 is formed on the back surface of the substrate to cover the back surface of the substrate except for embedded conductors 45 (FIG. 4C). Tin (Sn) 49 is plated on exposed portions of embedded conductors 45. Then, supporting substrate 47 is removed, and the resulting substrate is diced for singularization into chips to create interposer chip 40 (FIG. 4D).

The foregoing method can provide interposer chip 40 which has a thickness as small as 0.1 mm or less, and highly dense embedded conductors 45 which have a diameter of 10 um and are arranged at a pitch of 20 um or less.

Next, a description will be given of a method of assembling the memory module. FIGS. 5A to 5D are diagrams for describing steps until the core memory chips are laminated on the interface chip.

Figure 5A:
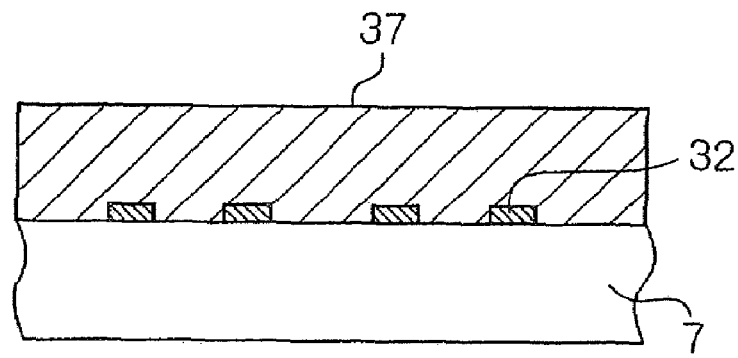
FIGS. 5A to 5D and 6A to 6C are diagrams for describing a method of assembling a memory module.
Figure 5B:

Supporting substrate 37 adheres to a surface of semiconductor substrate 7 on which bumps 32 have been formed for making an electric connection with an interface circuit for controlling DRAM signals, and for making an electric connection to the outside (FIG. 5A). Assume herein that the surface of semiconductor substrate 5 on which bumps 32 are formed is the front surface, and the opposite surface is the back surface. Then, the back surface of semiconductor substrate 7 is ground by a BG method until the thickness of semiconductor substrate 7 is reduced to 50 um. Then, supporting substrate 37 is removed, and the resulting substrate is diced for singularization into chips to create interface chip 30 (FIG. 5B).

Figure 5C:
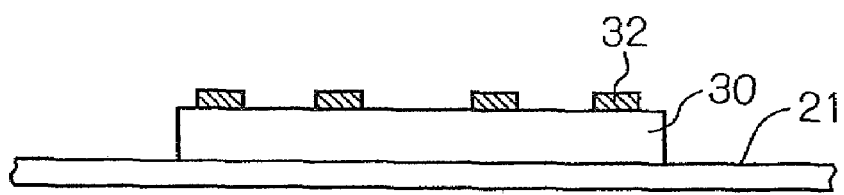
Figure 5D:
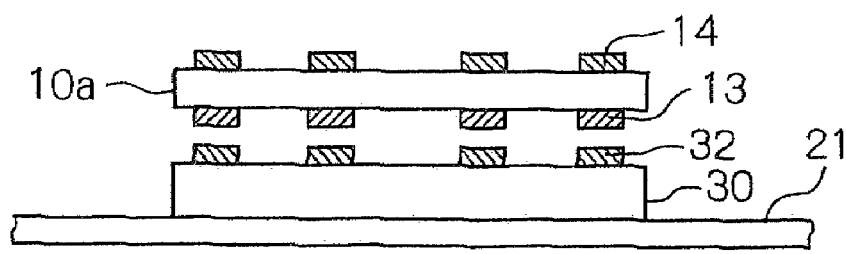

As illustrated in FIG. 5C, the back surface of interface chip 30 adheres to lead frame plate 21 through an adhesive layer (not shown) with the front surface of interface chip 30 oriented upward. Lead frame plate 21 is a plate-shaped material which comprises a plurality of lead frames 20 connected to each other before cutting. Next, as illustrated in FIG. 5D, bumps 13 of memory core chip 10a are aligned to bumps 32 of interface chip 30 with the circuit forming surface of memory core chip 10a oriented upward. Then, memory core chip 10a is placed on interface chip 30, and bumps 13, 32 are thermo-compression bonded to each other. The bumps are heated to temperatures of 230-240° C. Subsequently, memory core chips 10b, 10c, 10d are sequentially laminated, and the bumps are thermo-compression bonded to each other in a manner similar to memory core chip 10a. During thermo-compression bonding, a force applied to interface chip 30 is supported by lead frame plate 21.

Figure 6A:
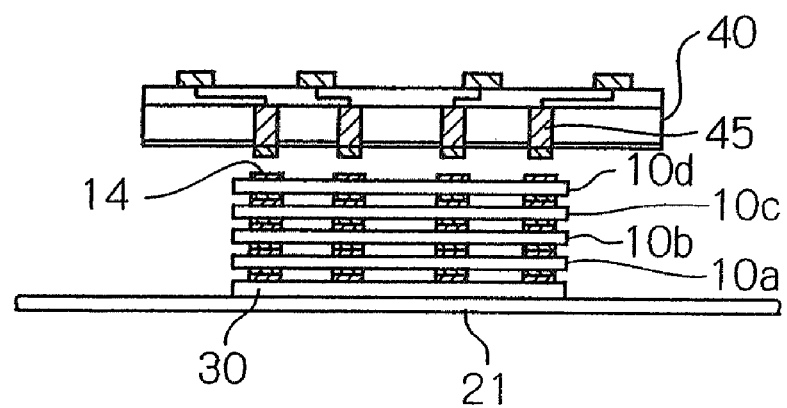
Figure 6B:
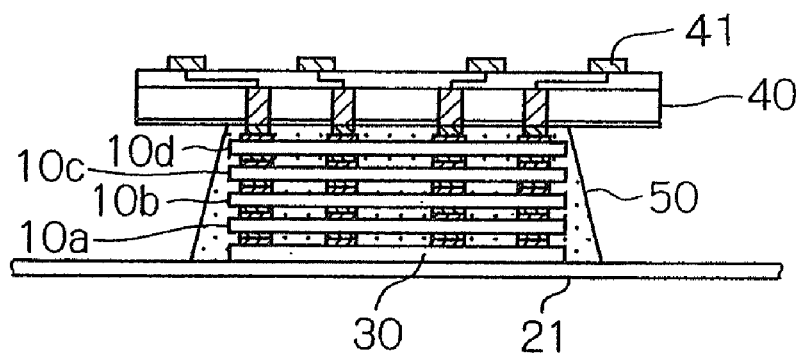
Figure 6C:
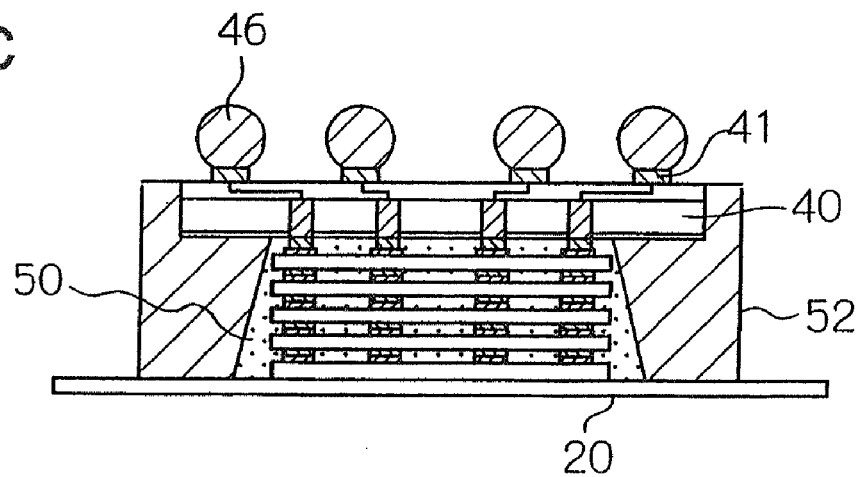

FIGS. 6A to 6C are diagrams for describing steps for forming solder balls.

As illustrated in FIG. 6A, bumps 14 of memory core chip 10d are aligned to embedded conductors 45 of interposer chip 40, and interposer chip 40 is placed on memory core chip 10d. Then, bumps 14 are thermo-compression bonded to embedded conductors 45. Next, underfill 50 is molded to fill interstices between the chips and to cover the side surfaces of interface chip 30 and memory core chips 10a-10d (FIG. 6B). For permeation into interstices of approximately 10 um, a resin used for underfill 50 has a viscosity lower than mold resin 52.

Subsequently, mold resin 52 is molded to cover exposed surfaces of interposer chip 40, except for the surface on which lands 41 are formed, and to cover the side walls of underfill 50. Since mold resin 52 surrounds the surfaces of interposer chip 40, except for the surface on which lands 41 are formed, and the side walls of underfill 50, moisture can be prevented from being introduced into the inside. Further, after solder balls 46 have been formed on lands 41, lead frame plate 21 is diced for singularization into memory modules (FIG. 6C).

Figure 7:
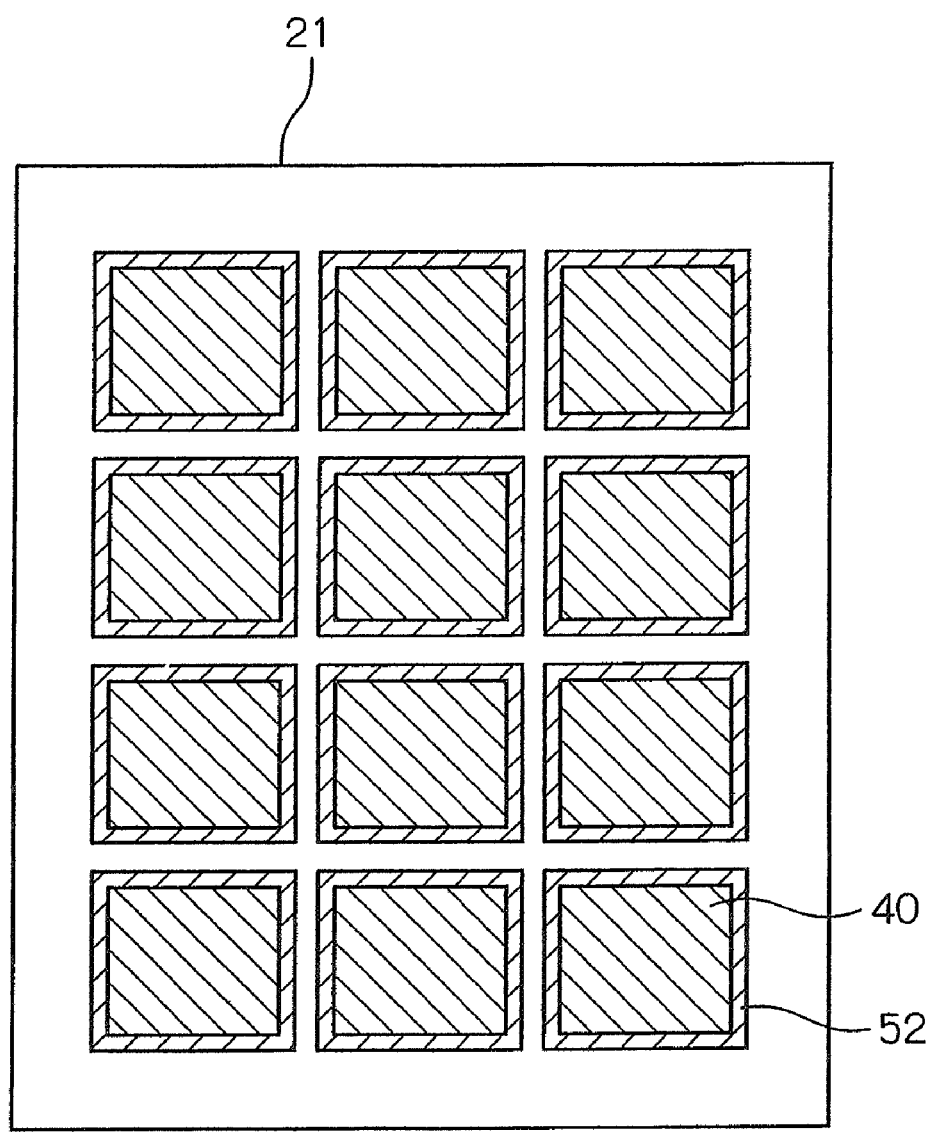
FIG. 7 is a top plan view illustrating an exemplary configuration of a lead frame plate.

FIG. 7 is a top plan view illustrating the lead frame plate before it is singularized into memory modules.

FIG. 7 illustrates 12 memory modules assembled on single lead frame plate 21. In this figure, the solder balls are omitted in the illustration. While the steps for forming a single memory module have been described with reference to FIGS. 5A to 5D and 6A to 6C, these steps are repeated for each memory module on the same lead frame plate 21. After the manufacturing process has reached the step of FIG. 6A, underfill 50 and mold resin 52 are collectively molded over 12 laminated chips having interface chip 30, memory core chips 10a-10d, and interposer chip 40, as illustrated in FIG. 7. Then, lead frame plate 21 illustrated in FIG. 6C is cut to correspond to laminated chips, and is separated into respective modules.

In the method of manufacturing the memory module of this embodiment, after singularizing into interface chip 30, the back surface of interface chip 30 adheres to lead frame 20 which serves as a support, so that the resulting memory module has increased mechanical strength against forces applied to interface chip 30 from the outside. When memory core chip 10 is laminated on interface chip 30 and the bumps are thermo-compression bonded to each other, a force applied to the front surface of interface chip 30 is supported by lead frame 20 through the overall back surface of the chip, thus making it possible to prevent the thin chip having low mechanical strength from being broken.

Also, since lead frame 20 functions as a heat dissipating plate for the memory module as mentioned above, lead frame 20 need not be peeled off interface chip 30.

In this event, lead frame 20 is preferably made of a metal material which is highly flexible in order to mechanically reinforce a semiconductor such as silicon which is highly fragile, and which has high thermal conductivity. Generally, such a material also has a large coefficient of thermal expansion. Lead frame 20 having a large coefficient of thermal expansion is not preferable in regard to reliability because large stresses are generated due to temperature changes between lead frame 20 and a semiconductor chip, made of silicon or the like, that adheres to lead frame 20, and large stresses can break the chip. It is therefore preferable to use a 42-alloy consisting of 58% of iron and 42% of nickel for the material of lead frame 20. This alloy exhibits a thermal conductivity of 14.6 W/m·K and a coefficient of thermal expansion of $5.6 \times 10^{-6}$/K. Though the thermal conductivity is lower than that of silicon (exhibiting a thermal conductivity of 168 W/m·K and a coefficient of thermal expansion of $2.6 \times 10^{-6}$/K), the difference in the coefficient of thermal expansion between the two materials is relatively small, so that this alloy can satisfy desired characteristics among metal materials. As appreciated from the foregoing, though there are few materials which can satisfy all characteristics, other materials as well such as stainless steel, copper alloy and the like can be used for lead frame 20 if their mechanical characteristics, thermal conductivity, and coefficient of thermal expansion satisfy required conditions.

Also, the chips are laminated by a method which involves laminating the chips on lead frame 20, which excels in mechanical strength, as a base, thus making it possible to laminate thin memory core chips, the thickness of which is 0.05 mm or less. Some conventional methods are incapable of laminating chips of 0.1 mm or less in thickness because the chips are broken in the middle of the lamination. On the other hand, because there are more and more applications for semiconductor chips in portable devices and the like, which require high density mounting, increasingly strict limitations have been placed on the height of semiconductor packages.

Recently, the height of packages is required to be limited to 1.2 mm or less. Assuming that solder balls 46 are 0.4 mm high, lead frame 20 is 0.12 mm thick, and interposer chip 40 is 0.1 mm thick, the remaining dimensional margin is 0.58 mm, which permits lamination of merely five memory core chips having a thickness of 0.1 mm at maximum. When chips of 0.05 mm thick are available for lamination, ten chips can be laminated, thus providing packages having a significant high density.

In regard to the molding step, it is generally difficult to individually encapsulate singularized modules. Even if they can be encapsulated, the number of steps such as handling increases, causes an increase in cost. In this embodiment, on the other hand, a plurality of memory modules are created on lead frame plate 21 which serves as a support, and the resin is collectively molded for all the memory modules before lead frame plates 21 is cut into respective modules. Since the resin molding is collectively performed for a plurality of memory modules, the number of steps required for the molding is largely reduced as compared with molding performed on a module-by-module basis. The manufacturing method of this embodiment is suitable for mass production.

In the present invention, by having a support adhere to a chip, even if the chip has a small thickness, the support stops force that is applied to the chip to alleviate a load on the chip, thus increasing the mechanical strength of the chip against forces applied thereto from the outside. As a result, the chips are prevented from being broken when they are laminated and applied with pressure. Also, when a plurality of memory modules are created on a single support, resin can be collectively molded for the plurality of memory modules. It is therefore possible to largely reduce the number of steps required for molding, reduce the cost of manufacturing the memory module, and improve productivity.

It should be noted that a plurality of memory core chips 10 need not be laminated, but single memory core chip 10 may be used alone.

While a preferred embodiment of the present invention has been described using specific terms, such description is for illustrative purposes only, and it is to be understood that changes and variations may be made without departing from the spirit or scope of the following claims.

What is claimed is:

1. A method of manufacturing a memory module having a memory core chip for storing information, an interface chip for controlling data input/output to/from said memory core chip, and an interposer chip for transmitting/receiving the data between said interface chip and an outside, said method comprising the steps of:
    adhering a support directly to a surface of said interface chip opposite to a surface on which a bump is formed;
    subsequently placing said memory core chip on the surface of said interface chip on which the bump is formed, and thermo-compression bonding the bumps of said interface chip and said memory core chip to each other; and
    placing said interposer chip on said memory core chip, and thermo-compression bonding the bumps of said memory core chip and said interposer chip to each other, wherein said support holds said interface chip, said memory core chip and said interposer chip at said thermo-compression bonding steps.

2. The method of manufacturing a memory module according to claim 1, further comprising the step of encapsulating side surfaces of said interface chip, said memory core chip, and said interposer chip with a resin after thermo-compression bonding the bumps of said memory core chip and said interposer chip to each other.

3. The method of manufacturing a memory module according to claim 1, further comprising the steps of:
    adhering a plurality of said interface chips to said support in said step of adhering a support directly to a surface of said interface chip opposite to a surface on which a bump is formed;
    encapsulating side surfaces of laminated chips including said interface chips, said memory core chip, and said interposer chip, after the step of thermo-compression bonding the bumps of said memory core chip and said interposer chip; and
    cutting said support corresponding to said laminated chips encapsulated with the resin.

4. The method of manufacturing a memory module according to claim 2, further comprising the step of mounting an external connection terminal in closest proximity to said interposer chip for electrically connecting to the outside after the step of encapsulating with a resin.

5. The method of manufacturing a memory module according to claim 3, further comprising the step of mounting an external connection terminal in closest proximity to said interposer chip for electrically connecting to the outside after the step of encapsulating with a resin.

6. The method of manufacturing a memory module according to claim 1, wherein said support is made of a metal plate.

7. The method of manufacturing a memory module according to claim 6, wherein said support is a lead frame.

8. A method of manufacturing a memory module comprising;
    preparing for a plurality of memory core chips;
    preparing for an interface chip to control data transfer to/from each of the memory core chips, wherein the interface chip has a first surface and a second surface which is opposite to the first surface;
    preparing for an interposer chip to transfer the data between the interface chip and an outside of the memory module;
    adhering a lead frame plate directly to the first surface of the interface chip;
    disposing the plurality of the memory core chips over the second surface of the interface chip after adhering the lead frame plate to the interface chip, and connecting the plurality of memory core chips and the interface chip by using thermo-compression bonding; and
    subsequently disposing the interposer chip over the plurality of the memory core chips such that the interposer chip is directly connected to one of the plurality of memory core chips, and thermo-compression bonding between the interposer chip and the memory core chip which is directly connected to the interposer chip.

9. The method of manufacturing a memory module according to claim 8, wherein each of the memory core chips comprises a plurality of bumps for thermo-compression bonding on a surface of each of the memory core chips.

10. The method of manufacturing a memory module according to claim 8, further comprising the step of encapsulating side surfaces of the interface chip, the plurality of memory core chips, and the interposer chip with a resin after thermo-compression bonding between the memory core chip and the interposer chip.

11. The method of manufacturing a memory module according to claim 8, further comprising;
    forming a plurality of external connection terminals over a surface of the interposer chip at an opposite side to which the memory core chip is connected.

12. The method of manufacturing a memory module according to claim 11, wherein the external connection terminals are solder balls.

13. The method of manufacturing a memory module according to claim 8, wherein the lead frame plate is made of a metal.

14. The method of manufacturing a memory module according to claim 13, wherein a size of the lead frame plate is larger than a size of the interposer chip when viewed from a surface of the interposer chip at an opposite side to which the memory core chip is connected.

* * * * *